United States Patent [19]

Gill et al.

[11] Patent Number: 5,047,981

[45] Date of Patent: Sep. 10, 1991

[54] BIT AND BLOCK ERASING OF AN ELECTRICALLY ERASABLE AND PROGRAMMABLE READ-ONLY MEMORY ARRAY

[75] Inventors: Manzur Gill, Rosharon; Sung-Wei Lin; Iano D'Arrigo, both of Houston; David McElroy, Rosenberg, all of Tex.

[73] Assignee: Texas Instruments Incorporated, Dallas, Tex.

[21] Appl. No.: 374,113

[22] Filed: Jun. 30, 1989

Related U.S. Application Data

[63] Continuation-in-part of Ser. No. 219,529, Jul. 15, 1988, abandoned.

[51] Int. Cl.[5] ............................................. G11C 16/04
[52] U.S. Cl. .................................... 365/185; 365/218; 365/238.5
[58] Field of Search ............... 365/184, 185, 233, 218, 365/238.5; 357/23.5

[56] References Cited

U.S. PATENT DOCUMENTS

| | | | |
|---|---|---|---|
| 4,064,494 | 12/1977 | Dickson et al. | 365/184 |
| 4,112,509 | 9/1978 | Wall | 365/185 |
| 4,130,890 | 12/1978 | Adam | 365/184 |
| 4,377,857 | 3/1983 | Tickle | 365/185 |
| 4,451,905 | 5/1984 | Moyer | 365/104 |
| 4,511,996 | 4/1985 | Jacobs | 365/218 |
| 4,783,766 | 11/1988 | Samachisa et al. | 365/218 |
| 4,924,437 | 5/1990 | Paterson et al. | 365/218 |
| 4,949,309 | 8/1990 | Rao | 365/218 |

Primary Examiner—Glenn Gossage
Attorney, Agent, or Firm—W. James Brady, III; Melvin Sharp; James T. Comfort

[57] ABSTRACT

A method for either block- or bit-erasing is described for an array of EEPROM cells, each having transistor channel regions with subchannels thereof respectively controlled by a floating gate conductor and a control gate. Erasing occurs through a Fowler-Nordheim tunnel window (34) between a source bit line (24) and a floating gate conductor (42) of a selected cell. For one or more selected cells, first and second erasing voltages are selected such that the selected source bit line (24) is more positive than the selected word line (48) by a voltage sufficient to cause excess electrons on the floating gate conductor (42) to be drawn through the tunnel window (34) to the source region (24). The nonselected word lines (48) have a nonerasing voltage impressed thereon that is sufficiently close to that of selected source regions that no erase disturb will occur in nonselected cells.

11 Claims, 4 Drawing Sheets

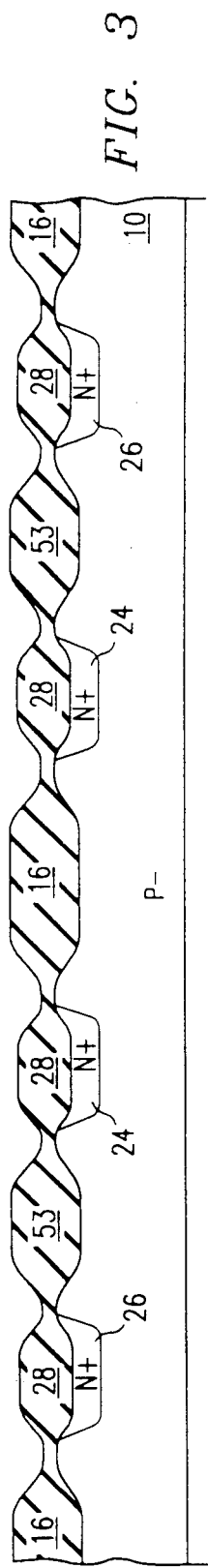
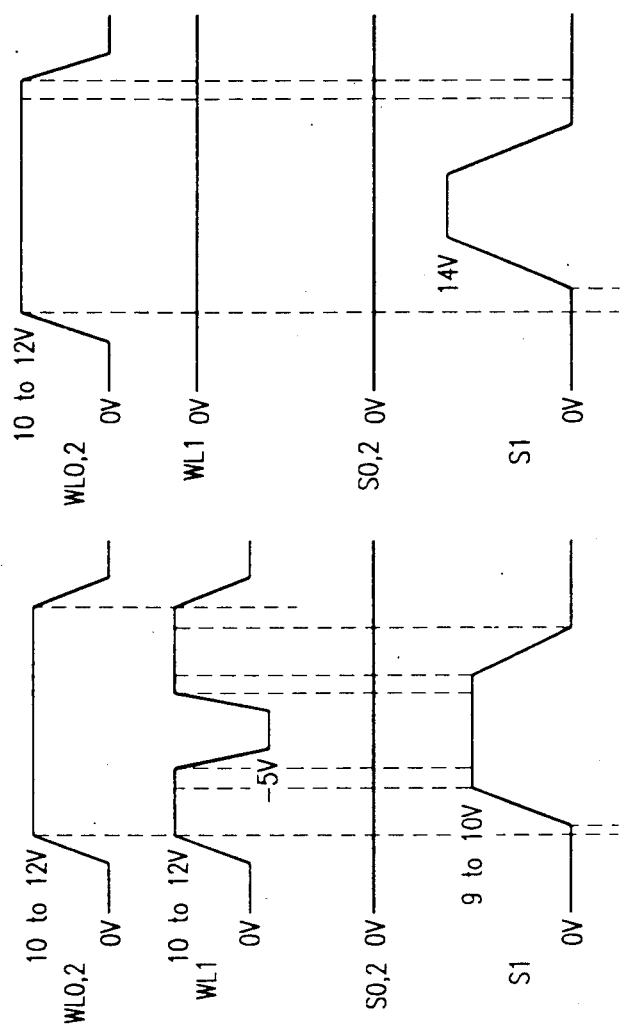
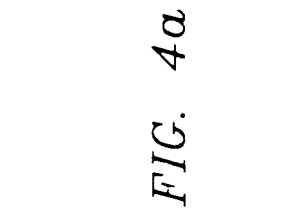
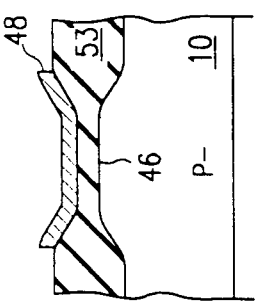
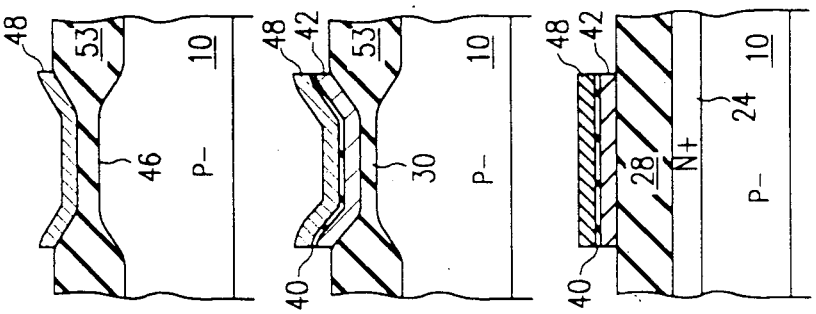

5,047,981

BIT AND BLOCK ERASING OF AN ELECTRICALLY ERASABLE AND PROGRAMMABLE READ-ONLY MEMORY ARRAY

RELATED APPLICATIONS

This application is a continuation-in-part of Ser. No. 07/219,529 filed July 15, 1988, now abandoned, and is further related to U.S. patent application Ser. No. 07/219,530, filed July 15, 1988, now abandoned; co-pending U.S. patent application Ser. No. 07/219,528, filed July 15, 1988, now abandoned; co-pending U.S. patent application Ser. No. 07/374,381, filed June 30, 1989; co-pending U.S. patent application Ser. No. 07/385,846, filed July 26, 1989, now U.S. Pat. No. 4,947,222; co-pending U.S. patent application Ser. No. 07/458,936 filed Dec. 29, 1989.

TECHNICAL FIELD OF THE INVENTION

The present invention relates to electrically erasable and programmable read-only memory cells, and more particularly to a method for erasing such cells.

BACKGROUND OF THE INVENTION

EPRoMs, or electrically programmable read only memories, are field effect devices with a floating gate structure. An EPROM floating gate is programmed by applying proper voltages to the source, drain and control gate of each cell, causing high current to flow through the source-drain path and charging the floating gate by hot electron injection. The EPROM device is erased by ultraviolet light, which requires a device package having a quartz window above the semiconductor chip. Packages of this type are expensive in comparison with the plastic packages ordinarily used for other integrated circuits. One such EPROM device is shown by U.S. Pat. No. 4,750,024, issued to John F. Schreck and assigned to Texas Instruments Inc.

EEPROMs, or electrically erasable and programmable read only memories, have been manufactured by various processes that usually require a much larger cell size than standard EPROMs and further require more complex manufacturing processes. EEPROMs can however be mounted in opaque plastic packages that reduce the packaging cost. Nevertheless, conventional EEPROMs have on the whole been more expensive on a per-bit basis.

More recently, a family of "flash" EEPROMs has been developed that allows an array of cells to be erased in bulk instead of each cell being erased individually. Because the EEPROMs may be erased in bulk, their cell size can be smaller.

To further reduce cell size and therefore the cost of manufacture, an EEPROM cell integrating an enhancement transistor with a floating-gate transistor has recently been devised. The structural characteristics of the cell and its method of manufacture have been fully disclosed in parent application Ser. No. 07/219,529, now abandoned. This application describes and claims a novel method for erasing such a cell, either on a per-bit basis or in blocks within an array of such cells.

SUMMARY OF THE INVENTION

One aspect of the invention comprises a method for erasing a block of EEPROM cells in an array of such cells. A preselected first erasing voltage is placed on a selected one of a plurality of word line rows that are spaced apart and formed over respective columns of memory cells. Each of the word line conductors is insulatively disposed adjacent a floating gate conductor for each cell in the respective row. A second preselected erasing voltage that is substantially more positive than the first erasing voltage is placed on a selected one of a plurality of elongate semiconductor bit lines formed in columns at an angle to the rows, with a column of memory cells being associated with each bit line. An insulative programming window is provided for each cell that spaces the floating gate conductor of the cell from the bit line. The remaining, unselected bit lines of the array are allowed to float. Where each selected word line conductor intersects the selected bit line, electrons are drawn from each programmed floating gate conductor in the selected column to the bit line thereof to erase the floating gate conductors in that column. Since the remaining bit lines are allowed to float, the electric potential between the remaining bit lines and the floating gate conductors underneath the selected word lines conductors is insufficient to erase nonselected floating gate conductors.

According to another aspect of the invention, cells may be erased one bit at a time by selecting only one word line conductor. Only the cell at the intersection of the selected word line conductor and the selected bit line will be erased. A nonerasing voltage is placed on the remaining, unselected word line conductors that is closer to the second erasing voltage than is the first erasing voltage. The electric potential between the nonerasing voltage and the second erasing voltage is insufficient to cause erasure of those cells formed at the intersections of the nonselected word line conductors and the selected bit line. A principal advantage of the invention is that erase disturb of the nonselected cells is prevented.

BRIEF DESCRIPTION OF THE DRAWINGS

Other aspects of the invention and their advantages will be discerned by reading the following detailed description when taken in conjunction with the drawings, in which:

FIG. 3 is a greatly enlarged schematic sectional view taken along line 3—3 of FIG. 2;

FIGS. 4a-4c are greatly enlarged schematic sectional views taken substantially along lines 4a—4a, 4b—4b and 4c—4c, respectively, of FIG. 2;

FIG. 6 is a set of voltage timing diagrams for an erasing operation with a negative word line erasing voltage; and FIG. 7 is a set of voltage timing diagram for an erasing operation with a word line erasing voltage of 0 volts.

DETAILED DESCRIPTION OF THE INVENTION

Figure 1A:
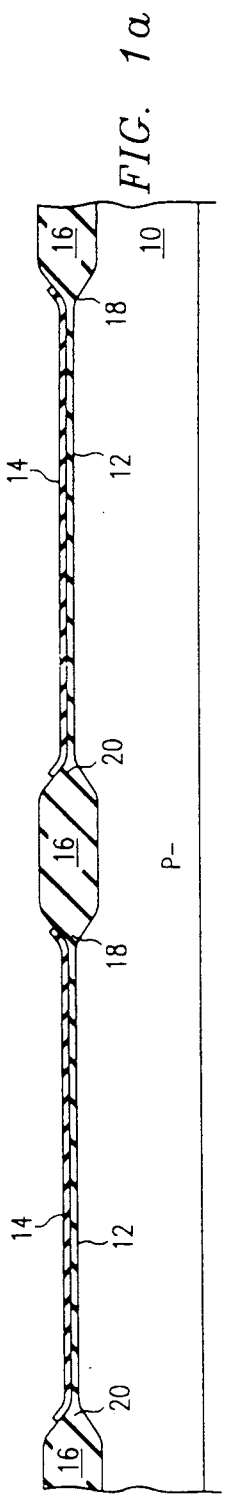
FIGS. 1a-1e are greatly enlarged sectional views of a portion of an EEPROM array, showing successive stages of fabricating the same.

A method of manufacturing an EEPROM array and cell for use with the invention will be first described in conjunction with FIGS. 1a-1e. Referring first to FIG. 1a, the starting material is a slice of silicon of which the illustrated section is only a very small portion. The fabrication takes place on a (P−) epitaxial layer 10, or on the surface of a (P−) substrate. The slice is perhaps 6 inches in diameter, while the portion shown in FIG. 1a is only a few microns wide.

A number of process steps would be performed to create transistors peripheral to the array, and these will not be discussed here. For example, the memory device may be of the complementary field-effect type having N-wells and P-wells formed in the layer 10 as part of a process to create peripheral transistors.

Figure 1B:
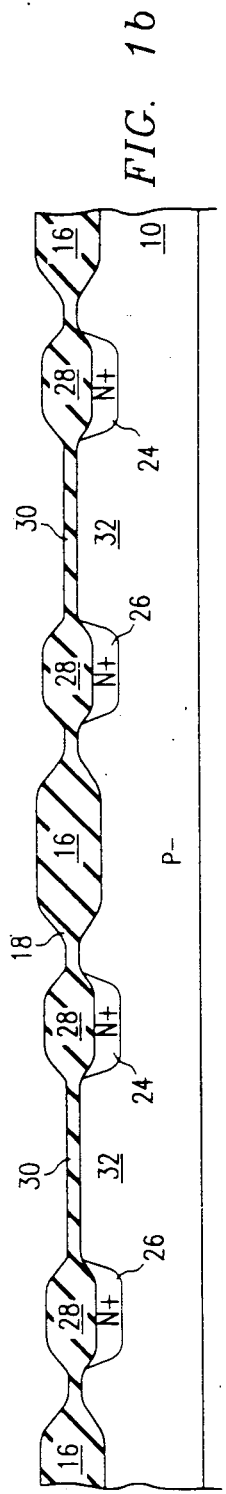
Figure 1C:
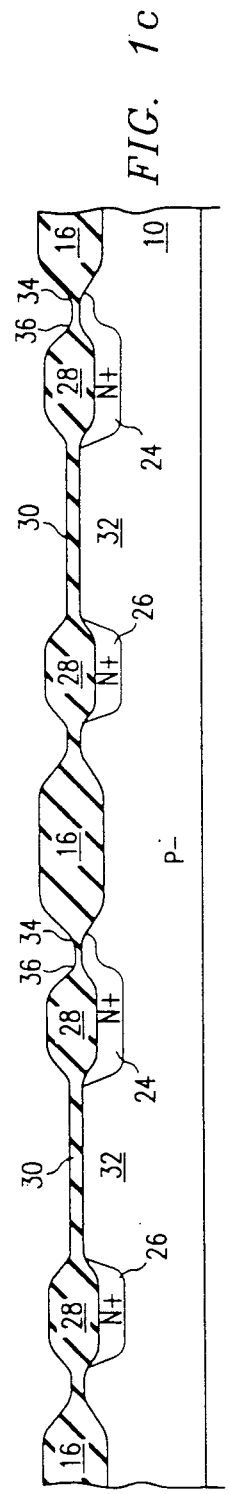
Figure 1D:
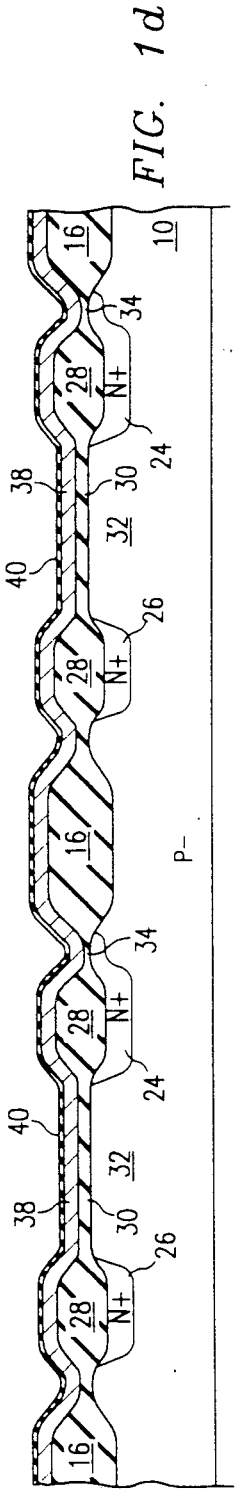
Figure 1E:
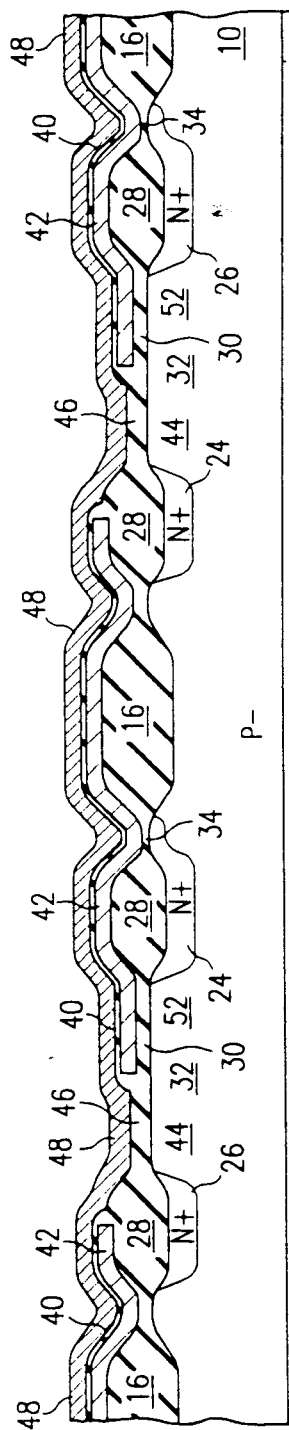
Figure 2:
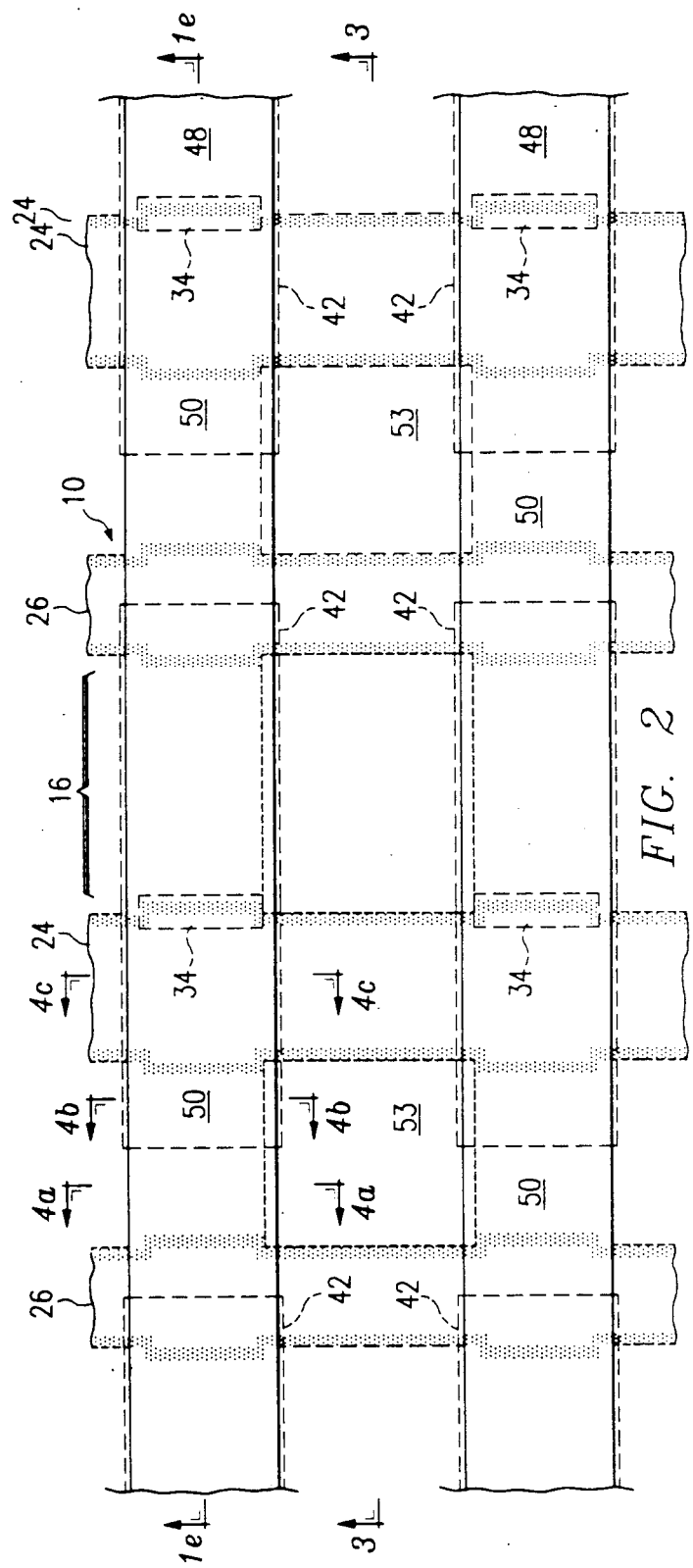
FIG. 2 is a plan view of a small portion of an EEPROM array according to the invention, with the sectional view shown in FIGS. 1a-1e taken substantially along line 1e-1e of FIG. 2.

The first step related to the cell array of the invention is applying oxide and silicon nitride coatings 12 and 14 as seen in FIG. 1, and patterning these coatings using photoresist to leave nitride layer 14 over what will be the channel regions, tunnel areas, sources, drains and bit lines (all described below), while exposing the areas where a thick field oxide 16 (and if an isolation oxide later described in conjunction with FIG. 2 is used) is to be formed. A boron implant at a dose of about $6 \times 10^{12}$ cm$^{-2}$ and an implantation energy of about 100 KeV is performed to create a (P) channel stop (not shown) beneath the field oxide 16 (and isolation oxide, if applicable). Then the field oxide 16 is grown to a thickness of about 10,000 Angstroms, for example, by exposing the slice to steam at about 900° C. for about several hours using any of several conventional techniques. The thermal oxide 16 grows beneath the edges of the nitride layers 14, creating "bird's beaks" 18 and 20 instead of sharp transitions.

Turning now to FIG. 1b, the nitride layers 14 are removed and, in the area where the bit lines (described below) are to be formed, an arsenic implant is performed at a dose of about $8 \times 10^{15}$ cm$^2$ at about 100 KeV, using photoresist as an implant mask, to create source regions or bit lines 24, and drain regions 26. Thick field oxide region 16 extends as strips to separate the source region 24 of one cell from the drain region 26 of an adjacent cell. Next, the pad oxide layer 12 residing on the layer 10 is stripped and another thermal oxide layer 28 is grown on the face to a thickness of about 2500 to 3500 Angstroms over the N+ buried source regions 24 and a corresponding drain region 26. A thinner oxide layer 30 grows on more lightly doped areas of the layer 10 at this time. The different thicknesses of oxide regions 28 and 30 are due to the difference in oxide growth rates when heavily-doped and lightly-doped silicon areas are exposed to an oxygen source at the same time. This oxidation is performed with steam at about 800° to 900° C.

At the transition areas where the bird's beaks 18 have been formed, the edge of the originally-formed thermal oxide region 16 has masked the arsenic implant so that the dopant concentration is lower, and so that the oxide growth in that area is less than that of the oxide layer 28.

Referring to FIG. 1c, a window 34 is opened in the oxide layer in a transition area 36 between oxide layer 28 and the adjacent field oxide region 16. This is done using photoresist as a mask, and etching through the oxide of the transition area 36 to the bare silicon; then regrowing a thinner oxide on the order of 100 Angstroms for the tunnel window 34. During oxidation of tunnel window 34, gate oxide 30 will grow to approximately 350 Angstroms, depending on the thickness of oxide layer 30 before this step. Optionally, a light phosphorus implant through the transition area 36 before the growth of the window oxide 34 can be used for improved operation of the cell.

Because of the curved surface of transition area 36, the width of tunnel window 34 may be controlled by varying the length of time for the etch through transition area 36.

Referring next to FIG. 1d, a first polysilicon layer ("poly 1") 38, doped (N+) beforehand or in situ to be conductive, is applied to the face of the slice to a thickness of approximately 3500 Angstroms, and a coating 40 of oxide, or preferably oxide-nitride-oxide, is formed to separate the first polysilicon layer 38 from a second polysilicon layer described below.

Referring to FIG. 1e, the first-level polysilicon layer 38 is patterned using photoresist to define a plurality of floating gate conductors 42. The oxide-nitride-oxide layer 40 is then etched using this photoresist as a mask, and the polysilicon layer 38 (FIG. 1d) is then etched in a self-aligned step to partially define the floating gate conductors 42. At this point, the floating gate conductors 42 exist as elongate strips running in the (y) or column direction, which is perpendicular to the paper in FIG. 1e. A later stack etch (described below) separates the floating gate conductors from one another in any one column.

The oxide layer 30 is then etched from the face of subchannel regions 44 of channel regions 32 and a threshold adjust implant may be done within subchannel regions 44, using the oxide layer 28 and the floating gate conductor 42 as a self-aligned mask.

An oxidation step is thereafter performed that will oxidize the exposed vertical edges of the floating gate conductors 42. This oxidation step also defines the thickness of a gate oxide layer 46 over each subchannel region 44. The thickness of the gate oxide 46 is approximately 400 to 500 Angstroms.

Next, a second polysilicon layer is deposited, doped (N+) to be conductive, and patterned using photoresist to create a plurality of parallel spaced-apart word lines or control gates 48. At the same time that the control gate conductors 48 are defined, the edges of the first-level polysilicon floating gate conductors 42 are defined in the y direction, which is perpendicular to the paper in FIG. 1e. It should be noted that the FIGURES are schematic only and are not necessarily drawn to scale. In particular, the thicknesses of the first and second polysilicon layers 38 and 48 are generally much greater than the thicknesses of the oxide layers 34, 30 and 46.

One advantage of the placement of the tunnel window 34 on the opposite side of the source region 24 from the drain region 26 is that the alignment of the masks during manufacture is considerably less critical when compared to conventional methods. In addition, the junction breakdown voltage between the buried (N+) source region 24 and the substrate 10 is enhanced due to the fact that on all sides of the PN junction, the overlying oxide has greater thickness than the 100 Angstrom tunnel oxide 34.

Additionally, the overall cell size can be reduced because alignments for the tunnel oxide 34 need not be considered. The tunnel oxide itself can have a width smaller than the minimum width allowed by usual design rules. Also, the cell can be "scaled" downwardly in a redesign.

Referring next to FIGS. 2, 3 and 4a–4c, and particularly to FIG. 2, a plan view of a small section of the array is shown. A plurality of memory cells are each shown at 50 and are formed at a face of the semiconductor layer 10 in rows and columns. Each row of cells 50 has diffused into the substrate 10 an elongate bit line or source region 24, identified by stippling. Also diffused into the substrate 10, for each source region 24, is an elongate diffused drain region 26 that runs in parallel in a longitudinal direction to its associated source region 24. Drain region 26 is also identified by stippling.

For each cell 50, a floating gate conductor 42, identified by a dashed rectangle, is provided that is insulatively disposed over a subchannel region 52 (FIG. 1e) of a respective channel region 32, and is also formed as an elongate horizontal strip completely over the respective source region 24 and extending over the drain region 26 of the next adjacent cell. Each cell 10 further has a tunnel window 34 shown by a dotted outline that is underneath its respective floating gate conductor. Each tunnel window 34 can be as long as the width of the word line conductor 48 under which it resides.

The horizontal (as seen in FIG. 2) edges of each floating gate conductor 42 are aligned with a respective word line conductor 48; the illustrated offset between edges is for the purpose of clarity only. Each row of cells 50 has a word line conductor 48 extending thereover in a horizontal (x) direction.

The coupling between the control gate conductor 48 and the respective floating gate conductors 42 underneath it is enhanced because each floating gate conductor 42 extends completely across the corresponding bit line 24 and over an oxide isolating area 16 (shown, for example, by the bracket in FIG. 2) as well. Therefore, a larger fraction of the programming/erasing voltages applied to the control gate or word line conductor 48 on any row of cells will appear between the floating gate conductor 42 and the underlying source or bit line 24. Each cell 50 is "contact free" in that no source or drain contact from above is needed in the vicinity of the cell itself.

In one embodiment, an area 53, represented in FIG. 2 as a dashed enclosure, is used to isolate cells from one another in the (y) or vertical direction. This area 53 may be a thick field oxide layer similar to field oxide regions 16 as shown in FIG. 1e. Alternatively, each area 53 may be implanted with a (p) type impurity.

FIG. 3 is a sectional view taken substantially along line 3—3 of FIG. 2 and shows the isolation regions 53 between the elongate source regions 24 and adjacent drain regions 26 in non-cell locations on the array. FIGS. 4a–4c are schematic sectional views taken respectively along lines 4a—4a, 4b—4b and 4c—4c of FIG. 2, showing the disposition of a word line conductor 48 over the substrate and gate oxide layers 30 and 46 (in the cases of FIGS. 4a and 4b), and also showing the extended coupling between the word line conductor 48 and one of the floating gate conductors 42 within the same row, in the cases of FIGS. 4b and 4c. Although not shown in the FIGURES, after the stack etch it is desirable to form cap oxide and sidewall oxide on all exposed polysilicon surfaces. This improves data retention.

The operation of the device can best be described with the aid of the table set forth immediately below.

TABLE

| | PROGRAM (1,1) | READ(1,1) Alt2 | READ(1,1) Alt2 | ERASE (1,1) | BLOCK ERASE |
|---|---|---|---|---|---|
| WL0 | $V_{AUX1}$ | 0 V | 0 V | $V_{AUX3}$ | $V_{EW}$ |
| WL1 | 18 V | 3 V | 3 V | $V_{EW}$ | $V_{EW}$ |
| WL2 | $V_{AUX1}$ | 0 V | 0 V | $V_{AUX3}$ | $V_{EW}$ |
| S0 | $V_{AUX2}$ | 0 V | 0 V | ~0 V | ~0 V |
| D0 | FLOAT | FLOAT | FLOAT | FLOAT | FLOAT |
| S1 | 0 V | 0 V | 1.5 V | $V_{EB}$ | $V_{EB}$ |
| D1 | FLOAT | 1.5 V | 0 V | FLOAT | FLOAT |
| S2 | $V_{AUX2}$ | 0 V | 0 V | ~0 V | ~0 V |
| D2 | FLOAT | FLOAT | FLOAT | FLOAT | FLOAT |

| VOLTAGE VALUES FOR ABOVE TABLE | | |
|---|---|---|
| | CASE 1 | CASE 2 |
| $V_{AUX1}$ | 7 V to 9 V | 7 V to 9 V |
| $V_{AUX2}$ | 6 V to 7 V | 6 V to 7 V |
| $V_{EW}$ | −5 V | 0 V |
| $V_{EB}$ | 9 to 10 V | 14 V |
| $V_{AUX3}$ | 10 to 12 V | 10 to 12 V |

Figure 5A:
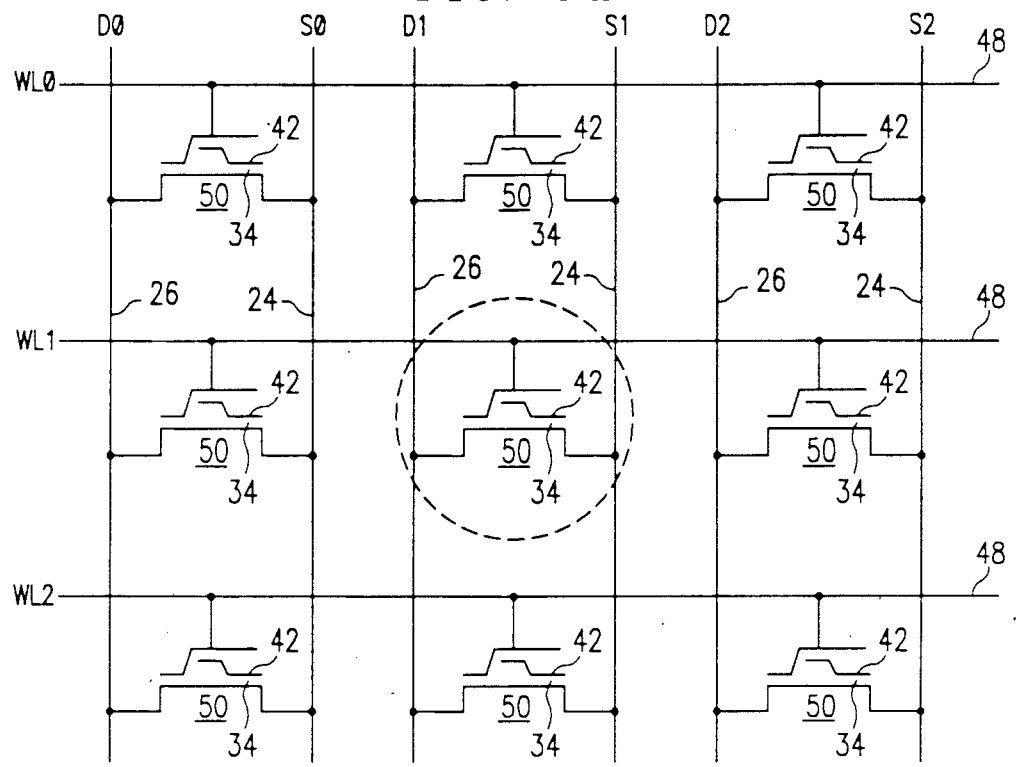
FIG. 5a is a schematic electrical diagram of a small portion of the EEPROM array illustrated in FIGS. 1e-4c, illustrating bit erasure.

The table should be read in conjunction with FIG. 5a, which is a schematic electrical diagram of a 3×3 portion of an array of EEPROM cells according to the invention, with like parts being identified by like numbers throughout FIGS. 1a–5b. Reference is also made to FIG. 1e for the physical structure involved.

The first column of the above table is a set of voltages applied to various components of a memory cell 50 sitting at the (1,1) position of the mini-array shown circled in FIG. 5a. A programming voltage in the range of 16 to 18 volts is applied to the selected word line WL1. The selected source S1 has a second programming voltage of 0 volts applied to it, thereby causing an electric potential from the source region 24 to the control gate 48 of 16 to 18 volts to occur. The described cell has a capacitive coupling coefficient of about 0.7 to 0.8 between the word line conductor 48 and the floating gate conductor 42. Therefore, a programming potential of about 12 to 13 volts can exist between the floating gate conductor 42 and the bit line 24. In the EEPROM cell 50 as described, this is sufficient to draw electrons from the source region 24 across the programming window 34 through Fowler-Nordheim tunneling on to the floating gate conductor 42.

Meanwhile, the drain D1 associated with the source S1 is allowed to float such that there is no drain to source current in the cell that is being programmed. The nonselected source regions S0 and S2 are held at $V_{AUX2}$ that in the illustrated embodiment is chosen within the range of 6 to 7 volts. After capacitive coupling has been taken into account, the difference in potential between the floating gate conductor 42 and the nonselected source regions 24 is only about 6 to 7 volts, which is insufficient to cause Fowler-Nordheim tunneling across the tunnel oxide windows 34 of the nonselected cells 50.

It may be that many of the nonselected cells 50 have floating gate conductors 42 that are already programmed such that a negative voltage in the range of −2 to −4 volts resides thereon. Because each of the nonselected source regions or bit lines S0 and S2 has 6 to 7 volts impressed thereon, a significant electric potential of about 8 to 11 volts may exist across the tunnel oxide windows 34 of these nonselected but programmed cells, such that these programmed bytes may lose some charge. To counteract this "bit line stress" condition, the nonselected word lines WL0 and WL2 have a positive voltage impressed thereon that acts to dilute the electric field across the tunnel oxide windows 34. This voltage is, however, further selected to be significantly less positive than the word line programming voltage. In the illustrated embodiment, this $V_{AUX1}$ voltage is selected in the range of 7 to 9 volts.

The second column of the table describes the voltages applied to various components of the cell 50 when it is desired to be read. There are two alternatives given under respective column headings Alt 1 and Alt 2. According to the Alt 1 reading method, the deselected word lines WL0 and WL2 have zero volts impressed thereon, such that the subchannels 44 (FIG. 1e) are nonconductive and such that there is little or no drain to source current. A relatively small positive voltage of 3 volts is impressed on the selected word line WL1 to cause the subchannel 44 of the selected cell to be conductive. The deselected drain bit lines D0 and D2 are allowed to float, while a potential of 0 volts is applied to each of the sources S0-S2. The drain bit line D1 of the selected cell has a voltage $V_{DD}$ of 1.5 volts impressed thereon to create a potential difference between the selected drain and the selected source.

If a zero or negative voltage resides on the floating gate conductor 42 of the selected cell, the subchannel 52 (FIG. 1e) will be rendered nonconductive, and a logic "zero" will be sensed at the selected drain line 24. If, on the other hand, a positive voltage resides on the floating gate conductor 42, the subchannel 52 will be conductive. Since the subchannel 44 is also conductive, current will be sensed at the drain region 26 (FIG. 1e) as a logic "1".

The second reading alternative, Alt 2, is similar to the first except that the selected source S1 has 1.5 volts put thereon and the "1" or "0" bit is read at the source S1.

The third column of the table sets forth the voltages for a bit erase. The selected cell for this bit erase is shown circled in FIG. 5a. The selected word line WL1 has an erasing voltage $V_{EW}$ impressed thereon, while the selected source S1 has a second erasing voltage $V_{EB}$ placed on it. For the described characteristics of the cell, the difference between $V_{EB}$ and $V_{EW}$ is approximately 14 volts. A nonerasing, nonprogramming voltage $V_{AUX3}$ is placed on the nonselected word lines WL0 and WL2. $V_{AUX3}$ is selected to be close to $V_{EB}$ such that there will be only a small electric field across the tunnel window 34 (FIG. 1e). All drains D0-D2 are allowed to float. Approximately 0 volts is applied to the nonselected sources S0 and S2.

In one embodiment, a negative voltage source is available to the described array. In this case (Case 1), $V_{EW}$ may be chosen as −5 volts, and $V_{EB}$ accordingly is chosen as 9 to 10 volts. This will cause a sufficiently positive electric potential in the direction of the source region 24 that sufficient electrons will be driven off the floating gate conductor 42, upon the application of an erase pulse of a sufficient length, such that $V_{AUX3}$ is chosen as approximately 10 to 12 volts so as to be relatively close to $V_{EB}$.

In a second case, no negative voltage source is necessary. $V_{EW}$ instead may be chosen as 0 volts and $V_{EB}$ as a large positive voltage such as 14 volts. $V_{AUX3}$, applied to the nonselected word lines, is in this instance chosen to be somewhat higher, or approximately 10 to 12 volts.

Figure 5B:
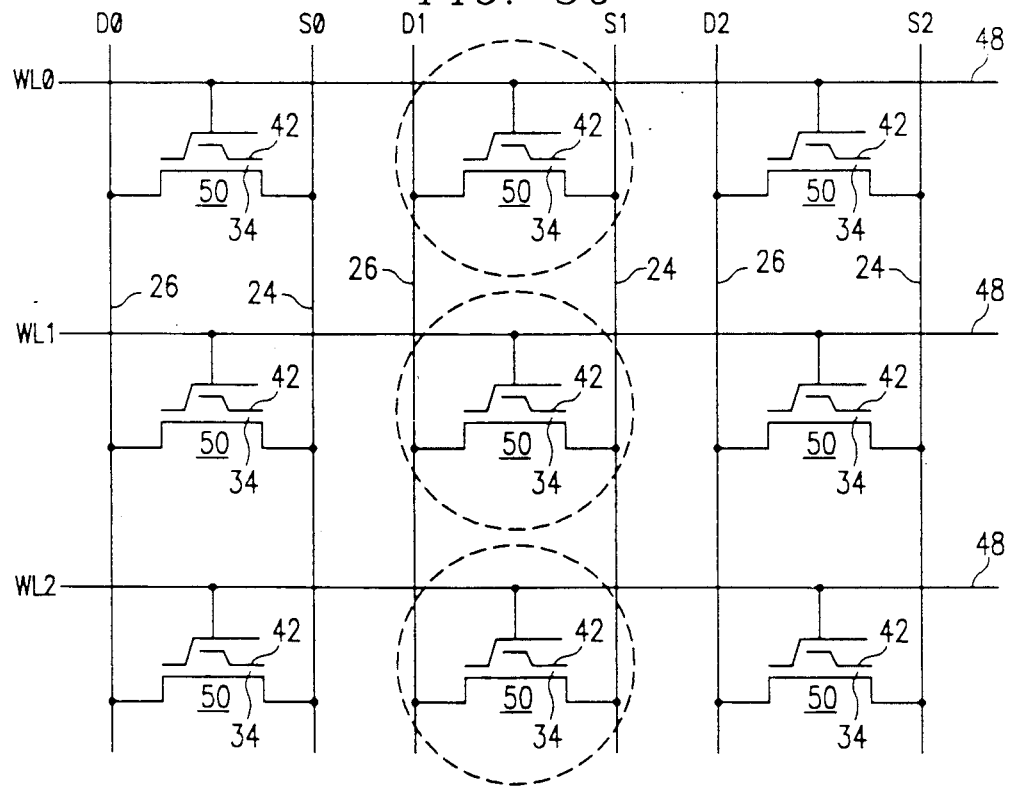
FIG. 5b is a schematic electrical diagram of a small portion of the EEPROM array shown in FIGS. 1e-4c, in particular illustrating block erasure.

FIG. 5b illustrates the case of a block erasure of a plurality of cells 50 that are each connected between S1 and D1. In a block erase, one or more columns of cells are erased at the same time. Each of the word lines WL0-WL2 has an erasing voltage $V_{EW}$ applied thereto. All drains D0-D2 are allowed to float. Approximately 0 volts is applied to the nonselected sources S0 and S2. The selected source S1 has $V_{EB}$ applied to it as before.

Referring to FIG. 6, a timing diagram is shown for the above-described Case 1 where a negative voltage potential is available to the chip. The deselected word lines WL0 and WL2 are ramped up from 0 volts to approximately 10-12 volts. At about the same time, the selected word line WL1 is also ramped to approximately 10-12 volts for an initial one millisecond period. The deselected source bit lines S0 and S2 stay at zero volts throughout. The selected bit line S1 is ramped up to approximately 9 to 10 volts a short time after the word lines have been raised to 10-12 volts. The selected bit line S1 should be raised to its erase voltage of 9 to 10 volts only after the nonselected word lines WL0 and WL2 have been raised to 10 to 12 volts to prevent a "disturb" of the nonselected cells.

A short time after the source line erasing voltage has been applied to S1, the selected word line WL1 is taken from approximately 10-12 volts to its erasing voltage of −5 volts for an interval sufficient to drive a sufficient number of electrons off of the floating gate conductor 42 of the selected cell, such that a positive voltage will reside on the floating gate conductor 42. The selected word line WL1 is thereafter returned to its deselected state of 10 to 12 volts. Next, the selected source bit line S1 is returned to its "read mode" state of zero volts. A short time after this occurs, the word lines WL0-WL2 are also returned to "read mode" at 0 volts.

Voltage timing diagrams for Case 2 are illustrated in FIG. 7. The deselected bit lines S0 and S2 are at approximately 0 volts. The deselected word lines WL0 and WL2 are raised to approximately 10 to 12 volts. This voltage is insufficient to cause reverse tunneling of electrons from the floating gate conductors disposed between the deselected word lines 42 and the deselected source bit lines 24. The selected word line WL1 is held at 0 volts throughout the erase cycle.

After the deselected word lines WL0 and WL2 have been raised to a value of approximately 10 to 12 volts, the selected source line S1 is raised to 14 volts. The voltage difference between the selected bit line and the deselected word lines will cause only a small electric field that is insufficient to cause a erase disturb. A 14 volt difference will exist between the selected word line and the selected source line which, after capacitive coupling is taken into account, is sufficient to drive a sufficient number of electrons off of the selected floating gate conductor 42 such that a positive voltage will be left thereon. A pulse of approximately 10 milliseconds is capable of accomplishing this erasure. A small interval is allowed to elapse before bringing down the deselected word lines 48 to their "read mode" state of 0 volts.

In summary, a novel method of erasing a EEPROM cell has been shown and described. The cell integrates the floating gate structure and a pass gate structure, which includes subchannel region 44, gate oxide layer 46, and the portion of word line 48 over subchannel region 44, between a source and a drain, although the concept also works for one-transistor cells. The invention provides for both block and bit erasure, and the erasing voltages may be selected according to the presence or absence of a negative voltage supply on-chip.

While preferred embodiments of the present invention and their advantages have been described in the above detailed description, the invention is not limited thereto but only by the spirit and scope of the appended claims.

What is claimed is:

1. A method for erasing a block of electrically erasable and programmable read-only memory cells in a semiconductor array of rows and columns of such cells, each column of memory cells having an elongate semiconductor source bit line spaced apart from an elongate semiconductor drain bit line, the source bit lines and drain bit lines being formed at an angle to the rows of memory cells, comprising the steps of:

preselecting first and second erasing voltages such that the second erasing voltage is substantially more positive than the first erasing voltage;

preselecting a third voltage such that the second erasing voltage is substantially more positive than the third voltages;

placing the first erasing voltage on each of a plurality of word line conductors formed to be spaced apart and over respective rows of memory cells, each word line conductor insulatively disposed adjacent, for each cell in the respective row, a floating gate conductor thereof; p1 placing the second erasing voltage on a selected one of the source bit lines, an insulative programming window for each cell in a respective column of memory cells spacing the floating gate conductor of that cell from the source bit line of the respective column of memory cells;

placing the third voltage on the remaining unselected ones of the source bit lines;

allowing the drain bit line of each column of memory cells to float;

in response to said steps of placing the first and second erasing voltages and allowing the drain bit line of each column of memory cells to float, drawing electrons from each programmed floating gate conductor in the column of memory cells associated with the selected source bit line to the selected source bit line to thereby erase previously programmed floating gate conductors in that column of memory cells; and in response to said steps of placing the first erasing voltage, placing the third voltage, and allowing the drain bit line of each column of memory cells to float, generating an electric potential between the remaining unselected source bit lines and the floating gate conductors associated therewith that is insufficient to erase the floating gate conductors in the columns of memory cells associated with the unselected source bit lines.

2. The method of claim 1, wherein said step of preselecting the first and second erasing voltages comprises selecting the first erasing voltage to be $-5$ volts and selecting the second erasing voltage to be in the range of 9 to 10 volts.

3. The method of claim 1, wherein the difference between the first and second erasing voltages is preselected to be approximately 14 volts.

4. The method of claim 1, wherein said step of preselecting the first and second erasing voltages comprises the steps of:

selecting the first erasing voltage to be 0 volts; and selecting the second erasing voltage to be at a positive potential sufficient to drive electrons to the selected bit line from each floating gate conductor associated therewith.

5. The method of claim 4, wherein said step of preselecting the second erasing voltage comprises the step of selecting the second erasing voltage to be approximately 14 volts.

6. A method for bit-erasing an electrically erasable and programmable read-only memory cell in an array of rows and columns of such cells, each column of memory cells having an elongate semiconductor source bit line spaced apart from an elongate semiconductor drain bit line, the source bit lines and drain bit lines being formed at an angle to the rows of memory cells, comprising the steps of:

preselecting first and second erasing voltage such that the second erasing voltage is substantially more positive than the first erasing voltage;

preselecting a third voltage such that the second erasing voltage is substantially more positive than the third voltage;

placing the first erasing voltage on a selected one of a plurality of word line conductors formed to be spaced apart and over respective rows of memory cells, each word line conductor insulatively disposed adjacent, for each cell in the respective row, a floating gate conductor thereof;

placing the second erasing voltage on a selected one of the source bit lines, an insulative programming window for each cell in a respective column of memory cells spacing the floating gate conductor of that cell from the source bit line of the respective column of memory cells;

placing the third voltage on the remaining unselected ones of the source bit lines;

allowing the drain line of each column of memory cells to float;

placing a nonerasing voltage that is closer to the second erasing voltage than is the first erasing voltage on remaining, nonselected ones of the word line conductors;

in response to said steps of placing the first and second erasing voltages and allowing the drain bit line of each column of memory cells to float, draining excess electrons from the floating gate conductor at the intersection of the selected source bit line and the selected word line conductor to the selected source bit line to thereby erase the floating gate conductor therebetween;

in response to said steps of placing the first erasing voltage, placing the third voltage, and allowing the drain bit line of each column of memory cells to float, generating an electric potential between the remaining bit lines and the nonselected floating gate conductors associated with the selected source bit line that is insufficient to erase the nonselected floating gate conductors associated with the selected source bit line; and in response to said steps of placing the nonerasing voltage, allowing the drain bit line of each column of memory cells to float, the placing the second erasing voltage, generating an electric potential between the nonselected floatings gate conductors associated with the selected source bit line and the selected source bit line that is insufficient to erase the nonselected floating gate conductors associated with the selected bit line.

7. The method of claim 6, and further comprising the steps of:

preselecting the first erasing voltage to be $-5$ volts; and preselecting the second erasing voltage to be in the range of 9 to 10 volts.

8. The method of claim 6, wherein the difference in electric potential between the selected word line conductor and the selected bit line is approximately 14 volts.

9. The method of claim 6, and further comprising the step of preselecting the nonerasing voltage to be in the range of 10 to 12 volts.

10. The method of claim 6, and further comprising the steps of:

preselecting the first erasing voltage to be 0 volts; and
preselecting the second erasing voltage to be a positive voltage sufficient to drive electrons to the selected bit line from each selected floating gate conductor associated therewith.

11. The method of claim 10 and further comprising the step of preselecting the second erasing voltage to be approximately 14 volts.

* * * * *